United States Patent
Lin et al.

(10) Patent No.: US 10,784,351 B2
(45) Date of Patent: Sep. 22, 2020

(54) 2D CRYSTAL HETERO-STRUCTURES AND MANUFACTURING METHODS THEREOF

(71) Applicants: TAIWAN SEMICONDUCTOR MANUFACTURING CO., LTD., Hsinchu (TW); National Taiwan University, Taipei (TW)

(72) Inventors: Shih-Yen Lin, Tainan (TW); Si-Chen Lee, Taipei (TW); Samuel C. Pan, Hsinchu (TW); Kuan-Chao Chen, Tainan (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 72 days.

(21) Appl. No.: 15/868,282

(22) Filed: Jan. 11, 2018

(65) Prior Publication Data

US 2018/0269291 A1 Sep. 20, 2018

Related U.S. Application Data

(60) Provisional application No. 62/472,673, filed on Mar. 17, 2017.

(51) Int. Cl.
*H01L 29/24* (2006.01)
*H01L 29/78* (2006.01)
(Continued)

(52) U.S. Cl.
CPC .......... *H01L 29/24* (2013.01); *H01L 21/0242* (2013.01); *H01L 21/02485* (2013.01);
(Continued)

(58) Field of Classification Search
CPC ... H01L 29/24; H01L 29/78; H01L 21/02614; H01L 21/02568; H01L 29/66969;
(Continued)

(56) References Cited

U.S. PATENT DOCUMENTS

| 9,576,950 B1 * | 2/2017 | Yeo | H01L 23/535 |
| 2017/0345944 A1 * | 11/2017 | Lin | H01L 29/778 |
| 2018/0114839 A1 * | 4/2018 | Wu | H01L 29/045 |

OTHER PUBLICATIONS

Chong-Rong WU et al., "Establishment of 2D Crystal Heterostructures by Sulfurization of Sequential Transition Metal Depositions: Preparation, Characterization, and Selective Growth", American Chemical Society, Nano Letters, vol. 16, Oct. 20, 2016, pp. 7093-7097.

(Continued)

*Primary Examiner* — Mouloucoulaye Inoussa
(74) *Attorney, Agent, or Firm* — McDermott Will & Emery LLP

(57) ABSTRACT

A method of fabricating a semiconductor device having two dimensional (2D) lateral hetero-structures includes forming alternating regions of a first metal dichalcogenide film and a second metal dichalcogenide film extending along a surface of a first substrate. The first metal dichalcogenide and the second metal dichalcogenide films are different metal dichalcogenides. Each second metal dichalcogenide film region is bordered on opposing lateral sides by a region of the first metal dichalcogenide film, as seen in cross-sectional view.

20 Claims, 24 Drawing Sheets

(51) Int. Cl.

| | | |
|---|---|---|
| *H01L 21/02* | (2006.01) | |
| *H01L 29/66* | (2006.01) | |
| *H01L 31/032* | (2006.01) | |
| *H01L 29/15* | (2006.01) | |
| *H01L 31/0352* | (2006.01) | |
| *H01L 29/778* | (2006.01) | |
| *H01L 29/10* | (2006.01) | |
| *H01L 29/786* | (2006.01) | |
| *H01L 29/423* | (2006.01) | |
| *H01L 31/109* | (2006.01) | |
| *H01L 21/20* | (2006.01) | |
| *H01L 21/683* | (2006.01) | |

(52) U.S. Cl.
CPC .. *H01L 21/02494* (2013.01); *H01L 21/02568* (2013.01); *H01L 21/02614* (2013.01); *H01L 21/02658* (2013.01); *H01L 21/2007* (2013.01); *H01L 21/6835* (2013.01); *H01L 29/1054* (2013.01); *H01L 29/158* (2013.01); *H01L 29/42384* (2013.01); *H01L 29/66969* (2013.01); *H01L 29/778* (2013.01); *H01L 29/78* (2013.01); *H01L 29/78681* (2013.01); *H01L 29/78696* (2013.01); *H01L 31/0324* (2013.01); *H01L 31/03529* (2013.01); *H01L 31/109* (2013.01); *H01L 2221/6835* (2013.01)

(58) Field of Classification Search
CPC ......... H01L 27/0688; H01L 21/823814; H01L 27/1203; H01L 29/04; H01L 29/0847; H01L 29/1606; H01L 29/41783; H01L 29/78648; H01L 29/78684; H01L 29/78696; H01L 29/267; H01L 27/11504; H01L 27/11587; C01G 39/06; B01J 27/045; C01B 32/186
USPC ........................................................ 257/295
See application file for complete search history.

(56) References Cited

OTHER PUBLICATIONS

Chong-Rong WU et al., "Multilayer MoS2 prepared by one-time and repeated chemical vapor depositions: anomalous Raman shifts and transistors with high On/Off ratio", Journal of Physics D: Applied Physics, vol. 48, (2015), pp. 1-7.

Ming Yang Li et al., "Epitaxial growth of a monolayer WSe2-MoS2 lateral p-n junction with an atomically sharp interface", Science Magazine, Nanoelectronics, vol. 349, Issue 6247, Jul. 31, 2015, pp. 524-528.

Ming-Yu Lin et al., "Toward epitaxially grown two-dimensional crystal hetero-structures: Single and double MoS2/graphene hetero-structures by chemical vapor depositions", Applied Physics Letters, vol. 105, No. 073501, (2014), pp. 1-5.

* cited by examiner

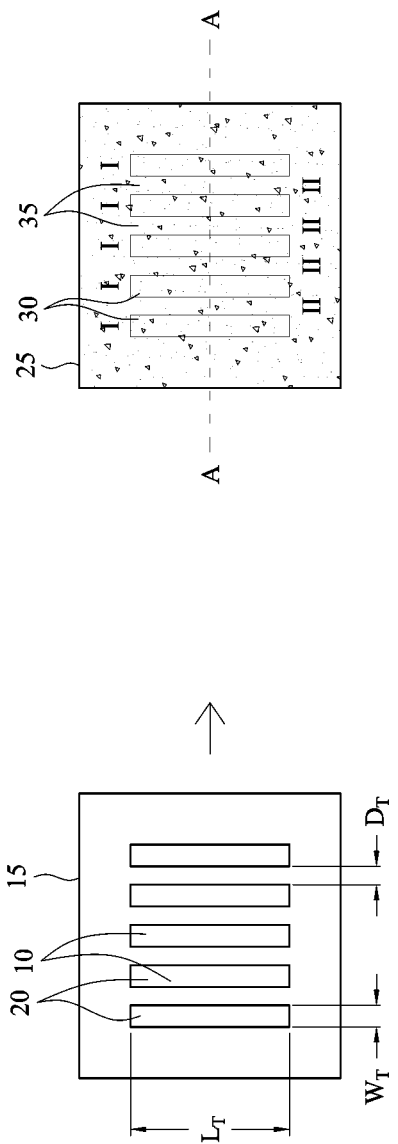

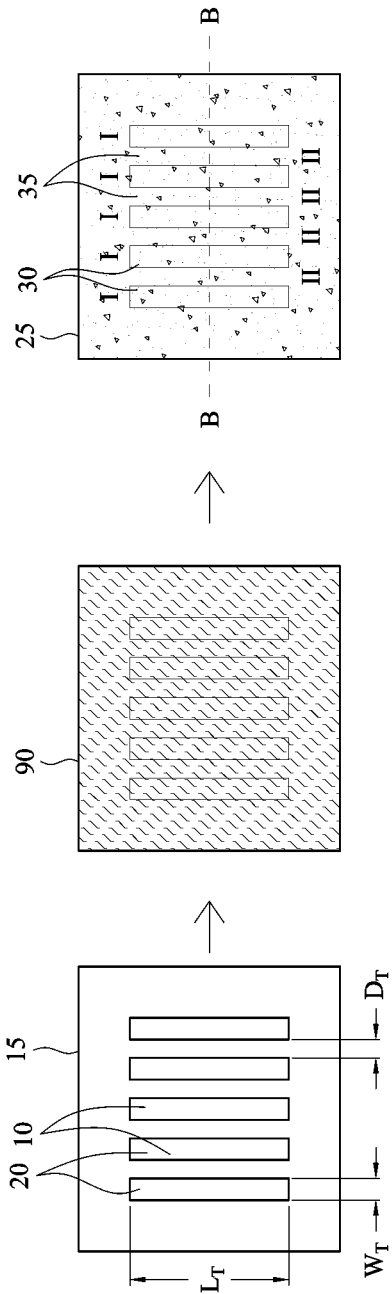

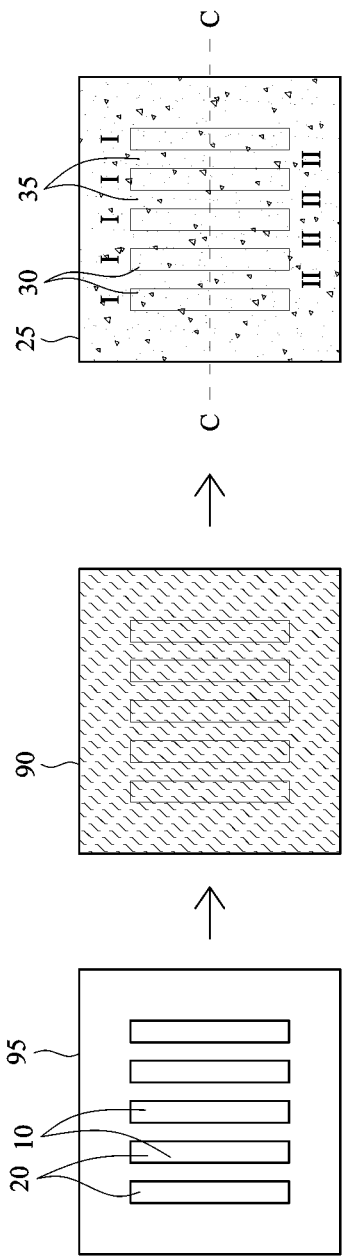

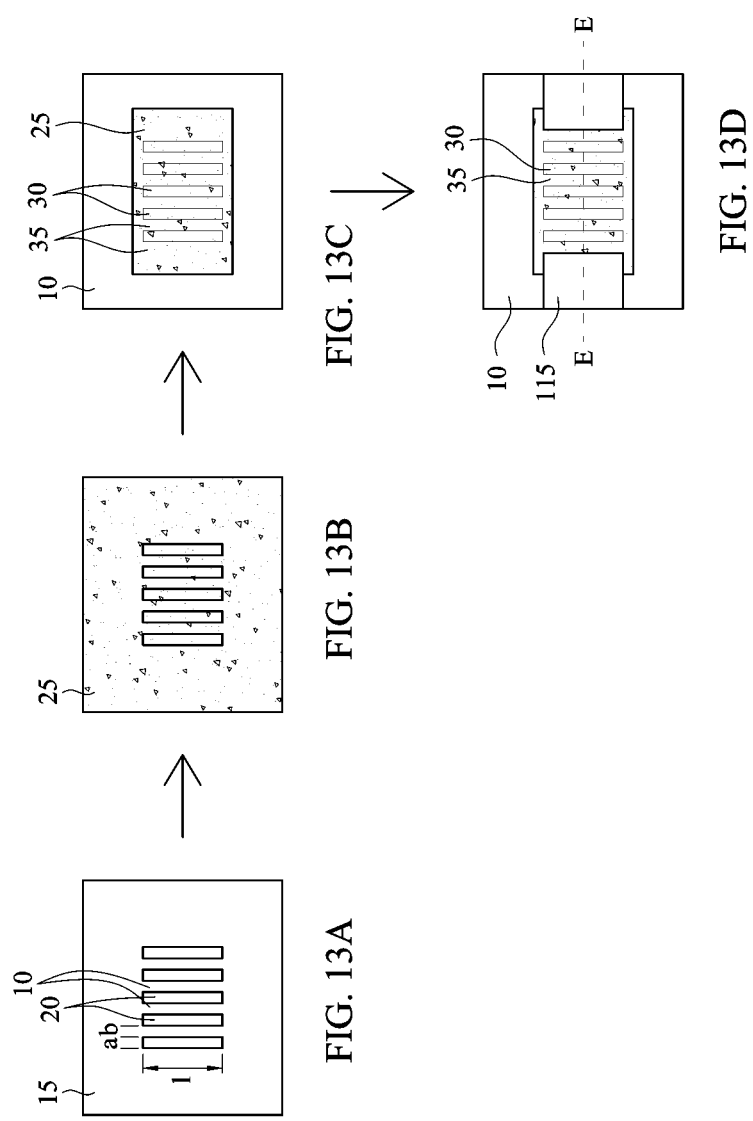

US 10,784,351 B2

2D CRYSTAL HETERO-STRUCTURES AND MANUFACTURING METHODS THEREOF

CROSS-REFERENCE TO RELATED APPLICATIONS

This application claims priority to U.S. Provisional Patent Application 62/472,673 filed Mar. 17, 2017, the entire disclosure of which is incorporated herein by reference.

TECHNICAL FIELD

The disclosure relates to two-dimensional (2D) materials for semiconductor devices, and more particularly to 2D crystal hetero-structures and manufacturing methods thereof.

BACKGROUND

A two-dimensional semiconductor (also known as a 2D semiconductor) is a type of natural semiconductor with thicknesses on the atomic scale. A 2D monolayer semiconductor is significant because it exhibits stronger piezoelectric coupling than traditionally employed bulk forms, which enables 2D materials applications in new electronic components used for sensing and actuating. Transition metal dichalcogenides have been used in 2D devices. Performance of single 2D transition metal dichalcogenide materials for device applications is reaching an upper limit. 2D materials with increased drain current are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A and 7B are plan views of various sequential stages of a method for forming a semiconductor device according to an embodiment of the disclosure.

FIGS. 9A, 9B, and 9C are plan views of various sequential stages of a method for forming a semiconductor device according to an embodiment of the disclosure.

FIGS. 10A, 10B, and 10C are plan views of various sequential stages of a method for forming a semiconductor device according to an embodiment of the disclosure.

FIGS. 13A, 13B, 13C, and 13D are plan views of various sequential stages of a method for forming a semiconductor device according to an embodiment of the disclosure.

DETAILED DESCRIPTION

Figure 1:
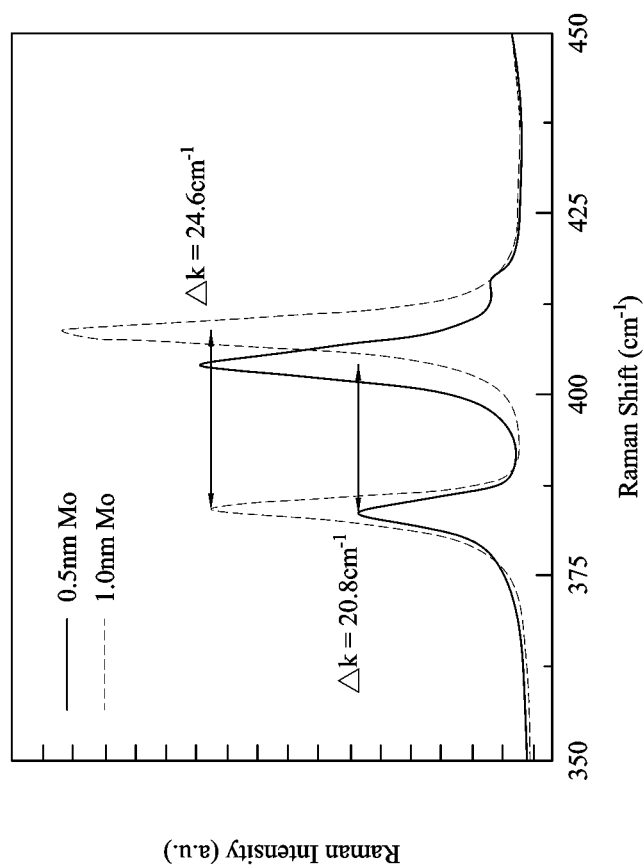
FIG. 1 shows Raman spectra of $MoS_2$ films of different thicknesses.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Recent investigations in enhanced 2D device performance have been in the field of 2D crystal hetero-structures. 2D crystal hetero-structures may provide improved device performance over single material 2D structures. 2D crystal hetero-structures can be established vertically by using either chemical vapor deposition (CVD) growth or sulfurization of pre-deposited transition metals. For example, compared with a $MoS_2$ transistor, significant drain current increase is observed for a $WS_2/MoS_2$ hetero-structure device. Field-effect mobility values of two devices with MoS$_2$ and WS$_2$/MoS$_2$ hetero-structures as the channels are 0.27 and 0.69 cm$^2$/V·s, respectively. This result indicates type-II band alignment, electron injection from WS$_2$ to MoS$_2$, and the formation of higher electron concentration channels under thermal equilibrium could be responsible for this phenomenon. Type-I structures are single monolayers that produce intense photoluminescence, while type-II structures produce significantly less photoluminescence due to much lower optical recombination probability of the type-II hetero-structures.

In some embodiments of the disclosure, the 2D material is a metal dichalcogenide having a layer thickness of about 0.5 nm to about 10 nm. In some embodiments, the metal dichalcogenide is a transition metal dichalcogenide. In some embodiments, the transition metal dichalcogenide is selected from the group consisting of MoS$_2$, WS$_2$, MoSe$_2$, WSe$_2$, MoTe$_2$, and WTe$_2$.

In some embodiments of the present disclosure, metal films with different thicknesses, are deposited on a substrate, by using an RF sputtering system. The metal films are subsequently converted to metal dichalcogenide films. For example, in some embodiments, a metal, such as molybdenum, is deposited, on a substrate, such as sapphire, by sputtering at a power ranging from about 10 to about 100 W at a background pressure of from about $5 \times 10^{-2}$ torr to about $5 \times 10^{-4}$ torr with an Ar gas flow of from about 10 sccm to about 100 sccm. After metal deposition, the samples are placed in the center of a hot furnace for chalcogenization, such as sulfurization. During the sulfurization procedure, Ar gas at a flow rate of from about 40 sccm to about 200 sccm is used as a carrier gas, and the furnace pressure ranges from about 0.1 torr to about 10 torr. The growth temperature for the samples is from about 400° C. to about 1200° C. About 0.5 g to about 2 g of S powder is heated in the gas flow stream to its evaporation temperature at about 120° C. to about 200° C. upstream of the furnace.

In a certain embodiment, the molybdenum is deposited on the sapphire substrate by sputtering at a power of about 40 W at a background pressure of about $5 \times 10^{-3}$ torr with about a 40 sccm Ar gas flow. The sulfurization operation takes place at an Ar flow rate of about 130 sccm, and a furnace pressure of about 0.7 torr in a furnace at about 800° C. The S powder (about 1.5 g) is placed in the gas flow upstream from the furnace and is heated to its evaporation temperature of about 120° C. Two samples with different Mo film thicknesses of 0.5 nm and 1.0 nm were prepared using the same sulfurization procedures. Large-area MoS$_2$ films can be obtained on the sapphire substrate by using this growth technique. With increasing MoS$_2$ thickness, the frequency difference Δk between the two Raman peaks increases, as shown in the Raman spectra of FIG. 1. The frequency differences Δk of the Raman peaks are 20.8 and 24.6 cm$^{-1}$ for two samples sulfurized with 0.5 nm and 1.0 nm thick Mo, respectively. The increasing Δk value suggests that more MoS$_2$ layers are obtained for the sample sulfurized with 1.0 nm thick Mo than 0.5 nm thick Mo.

In some embodiments, instead of the sulfurization operation to form for S-based materials (MoS$_2$, WS$_2$, etc.), selenization is performed to form Se-based materials, such as MoSe$_2$ and WSe$_2$, or tellurization is performed to form Te-based materials, such as MoTe$_2$ and WTe$_2$.

Figure 2:
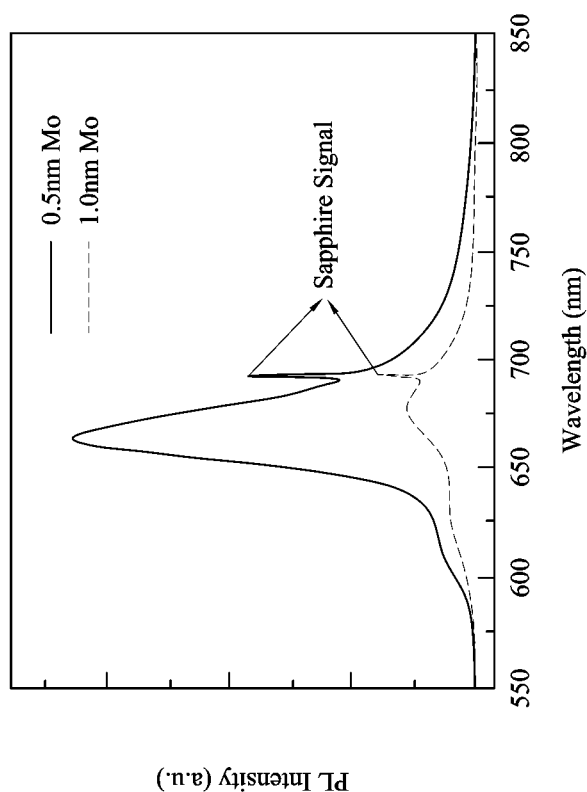
FIG. 2 shows photoluminescence spectra of $MoS_2$ films of different thicknesses.

Additional evidence supporting the different MoS$_2$ layer numbers obtained for the two samples comes from their photoluminescence (PL) spectra. Single-layer MoS$_2$ is a direct-bandgap material with bandgap value around 1.9 eV. With increasing layer number, the PL peak energies and intensities of the MoS$_2$ film gradually decreased. The PL spectra of two samples are shown in FIG. 2. As shown in FIG. 2, more intense luminescence at 1.87 eV is observed for the 0.5 nm thick Mo sulfurized sample. For the 1.0 nm thick Mo sulfurized sample, the PL intensity decreases and the PL peak energy shifts to 1.82 eV. The results suggest that with thicker Mo films, increasing MoS$_2$ layer numbers are obtained. The similar PL peak energy 1.87 eV with exfoliated MoS$_2$ and the bright luminescence suggest that a single-layer MoS$_2$ film is obtained for the sample sulfurized with 0.5 nm Mo. High resolution transmission electron microscopy (HRTEM) confirmed that 1-layer MoS$_2$ is formed with the 0.5 nm sample and 3-layer MoS$_2$ is formed with the 1.0 nm sample. Thus, more MoS$_2$ layers are obtained for the thicker sulfurized samples. In some embodiments, there is a close to linear dependence of MoS$_2$ layer numbers with the Mo film thicknesses, which enables good layer number controllability of this growth technique down to a single layer of MoS$_2$. The data show that monolayer MoS$_2$ provides greater PL intensity than multiple layers of MoS$_2$.

The metal dichalcogenide may be formed on a substrate. In some embodiments, the substrate includes silicon oxide or aluminum oxide substrates. In some embodiments, suitable silicon oxide substrates include silicon dioxide on silicon. In certain embodiments, the silicon substrate is a conductive substrate, such as a p-doped silicon. In other embodiments, suitable aluminum oxide substrates include sapphire.

Figure 3:
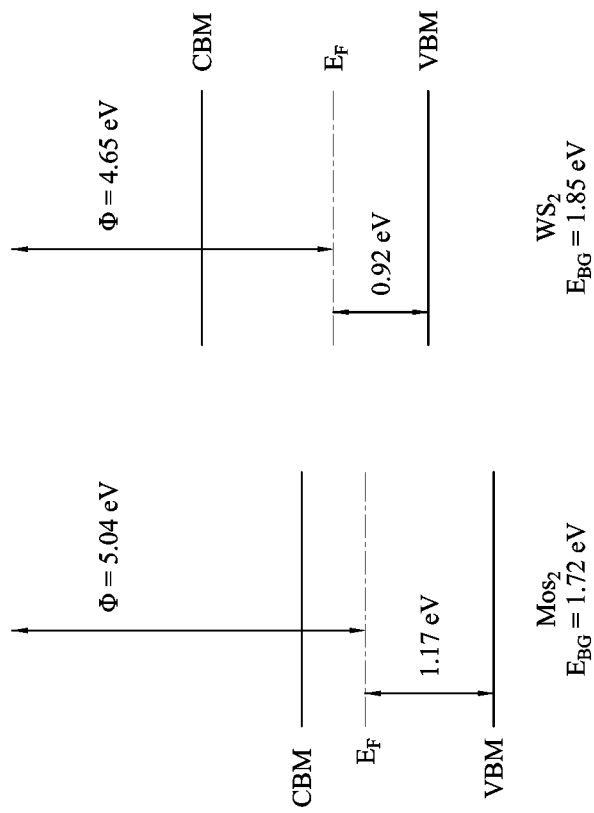
FIG. 3 shows the band alignment of $MoS_2$ and $WS_2$ films.

In the present disclosure, a hetero-structure including a film of a first metal dichalcogenide and a film of a second transition metal dichalcogenide is prepared. In some embodiments, a WS$_2$/MoS$_2$ hetero-structure is prepared. Ultraviolet photoelectron spectroscopy (UPS) and absorption spectrum measurements of the MoS$_2$ and WS$_2$ samples are performed. The band alignment of MoS$_2$ and WS$_2$ is shown in FIG. 3. MoS$_2$ and WS$_2$ samples have bandgap values of 1.72 eV and 1.85 eV, respectively. The cutoff binding energy values ($E_{cutoff}$) of MoS$_2$ and WS$_2$ are 1.17 and 0.97 eV, respectively. The cutoff binding energy is the difference between the Fermi level ($E_F$) and the valence band maximum (VBM). The work function value is $(\Phi) = h\upsilon - E_{cutoff}$, where the incident photon energy hυ is 21.2 eV. With the already known VBM positions, the position of the conduction band minimum (CBM) is extracted from the bandgap values of the two samples. When the two materials combine to form a hetero-structure, a type-II band alignment with a lower conduction band edge at MoS$_2$ is obtained. Because the work function of WS$_2$ is smaller than MoS$_2$, electrons in the WS$_2$ will be injected to the MoS$_2$ under thermal equilibrium. Thus, a channel with higher electron concentration can be obtained, which would enhance the field-effect mobility value for a transistor fabricated on the WS$_2$/MoS$_2$ hetero-structure with a MoS$_2$ channel.

Figure 4B:
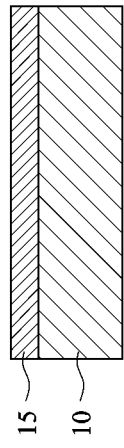
FIGS. 4A, 4B, 4C, 4D, 4E, and 4F are cross-sectional views of various sequential stages of a method for forming a semiconductor device according to an embodiment of the disclosure.
Figure 4D:
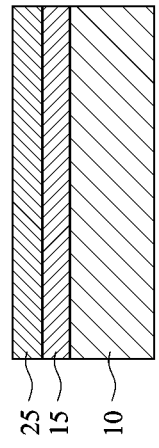
Figure 4A:
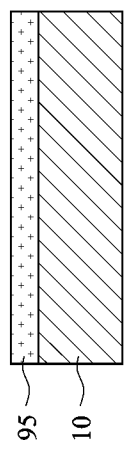

In an embodiment of the present disclosure, a semiconductor device having bottom gate electrodes is formed, as shown in FIGS. 4A-4F. In some embodiments, a first metal film 95 is formed on a first substrate 10, as shown in FIG. 4A. In certain embodiments, the first metal film is a Mo film about 1 nm thick formed by sputtering, and the substrate 10 is a sapphire substrate.

The first metal film 95 is converted to a first metal dichalcogenide film 15 by reacting the metal with a chalcogen selected from the group consisting of S, Se, and Te, as shown in FIG. 4B. In certain embodiments, first metal dichalcogenide is MoS$_2$ is formed by reacting a Mo film with evaporated sulfur in a furnace. In other embodiments, the first metal dichalcogenide is directly deposited onto the substrate using physical vapor deposition (PVD) or chemical vapor deposition (CVD) methods.

Figure 4C:
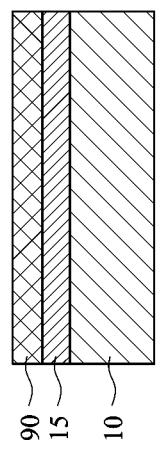
Figure 4F:
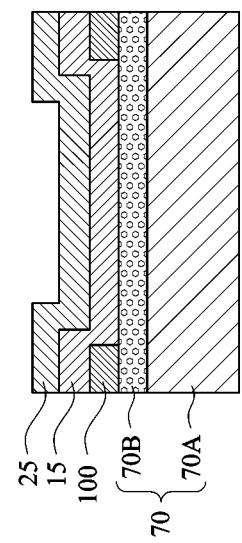

In some embodiments, a second metal film 90 different from the first metal film 95 is formed on a the first metal dichalcogenide film 15, as shown in FIG. 4C. In certain embodiments, the second metal film is about a 1 nm thick W film formed by sputtering.

The second metal film 90 is subsequently converted to a second metal dichalcogenide film 25 by reacting the metal with a chalcogen selected from the group consisting of S, Se, and Te, as shown in FIG. 4D. In certain embodiments, the second metal dichalcogenide is $WS_2$ formed by reacting a W film with evaporated sulfur in a furnace.

Figure 4E:
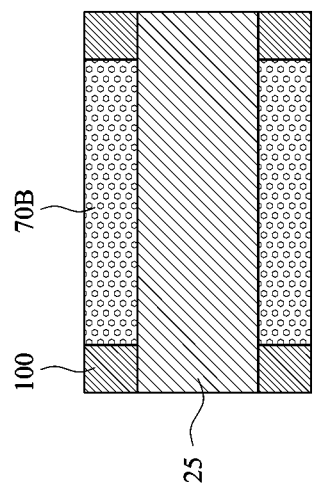

The first and second metal dichalcogenide films 15 and 25 are subsequently transferred to a second substrate 70, as shown in FIG. 4E, thereby forming a vertical hetero-structure. The transferring operation can be performed as disclosed herein. In certain embodiments, the second substrate 70 is a conductive substrate 70A with a dielectric layer 70B formed thereon. The conductive substrate 70A is p-doped polysilicon in some embodiments, and is conductive metal in other embodiments. Source/drain electrodes 100 are formed on the dielectric layer 70B in some embodiments. The transferred first and second metal dichalcogenide films 15 conformally cover portions of the source/drain electrodes 100 and the second substrate 70, as shown in the cross-sectional view FIG. 4E and plan view FIG. 4F. The method of transferring metal dichalcogenide films will be explained herein with reference to FIGS. 8A-8J.

In some embodiments, the metal dichalcogenide films are formed directly on a conductive layer instead of transferring the metal dichalcogenide film to a conductive substrate. For example, a conductive layer can be formed on substrate, and then first and second metal films are formed over the conductive layer. Then the first and second metal film undergo chalcogenization to form first and second metal dichalcogenide films. The conductive layer material is selected to withstand the heat of chalcogenization operation. After chalcogenization, the first and second metal dichalcogenide films are etched to form a desired shape or pattern in some embodiments.

In other embodiments where the metal dichalcogenide films are formed directly over the conductive layer, a first metal film is formed on the conductive layer and the first metal film undergoes chalcogenization to form a first metal dichalcogenide film. In some embodiments, the first metal chalcogenide film is patterned to form a desired shape or pattern, such as by etching. A second metal film is formed over the first metal dichalcogenide film, and the second metal film undergoes chalcogenization to form a second metal dichalcogenide film. In some embodiments, the second metal chalcogenide film is also patterned to form a desired pattern or shape, such as by etching. These techniques of forming the metal dichalcogenide films directly on conductive layers could be used to form semiconductor devices, including back gate transistors.

In some embodiments, the conductive substrate 70A is a gate electrode and the dielectric layer 70B is a gate dielectric layer. In certain embodiments, the dielectric layer 70B is silicon dioxide, in other embodiments the dielectric layer 70B is a high-k dielectric. The first and second metal dichalcogenide films 15 and 25 form the channel region of the transistor. In other words, the structure of FIG. 4F includes a dielectric layer 70B disposed on a first conductive layer 70A, a second conductive layer 100 disposed on a first region of the dielectric layer 70B, a third conductive layer 100 disposed on a second region of the dielectric layer 70B and spaced apart from the second conductive layer 100, and a metal dichalcogenide bilayer 15 and 25 disposed on the second and third conductive layers 100 and the dielectric layer 70B.

Figure 5:
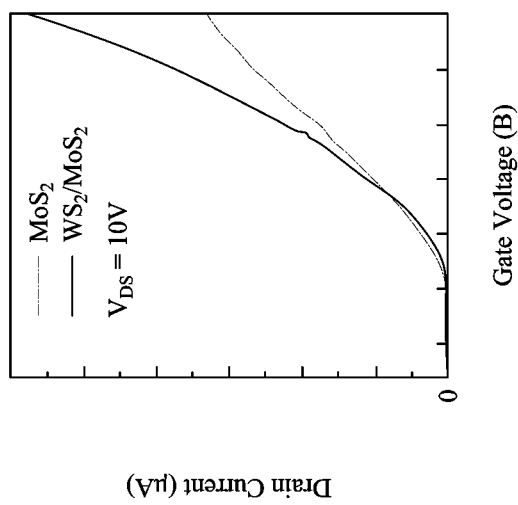
FIG. 5 shows the gate voltage versus the drain current for devices according to embodiments of the disclosure.

In some embodiments, bottom-gated transistors with 5-layer $MoS_2$ and 4-layer $WS_2$/5-layer $MoS_2$ as the channels are prepared according to the methods disclosed herein. Comparison $I_D$–$V_{GS}$ curves of the 5-layer $MoS_2$ channel and 4-layer $WS_2$/5-layer $MoS_2$ hetero-structure channel transistors at $V_{DS}$=10 V are shown in FIG. 5. Compared with the $MoS_2$ transistor, significant drain current increase is observed for the hetero-structure device. The field-effect mobility values of the two devices with $MoS_2$ and $WS_2$/$MoS_2$ hetero-structure as the channels extracted from the curves are 0.27 and 0.69 cm$^2$/V·s, respectively.

Figure 6:
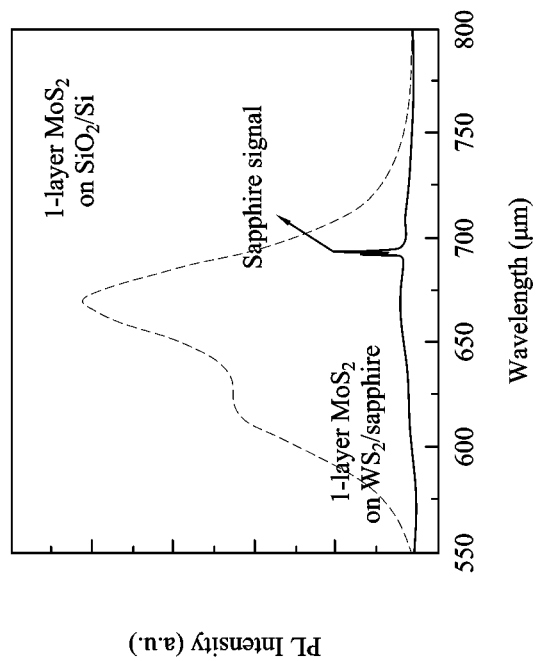
FIG. 6 shows photoluminescence spectra of $MoS_2$ films on different substrates.

2D metal chalcogenide crystal films can be transferred onto different substrates to obtain band alignments between different materials. For example, in some embodiments, 1-layer $MoS_2$ is transferred to 10-layer $WS_2$/sapphire and 300 nm $SiO_2$/Si substrates, respectively. Because 1-layer $MoS_2$ exhibits intense luminescence, as shown in FIGS. 1 and 2, the 1-layer $MoS_2$ on the $SiO_2$/Si substrate still exhibits intense PL intensity, as shown in FIG. 6. However, for the sample with 1-layer $MoS_2$ on the 10-layer $WS_2$/sapphire, weak luminescence is observed. The results suggest that due to the type-II band alignment of the $MoS_2$/$WS_2$ hetero-structure, the original intense type-I luminescence of 1-layer $MoS_2$ is significantly decreased due to the much lower optical recombination probability of the type-II hetero-structures.

Because a monolayer metal dichalcogenide arrangement provides improved luminescence intensity over a vertical metal dichalcogenide hetero-structure and a metal dichalcogenide hetero-structure provides improved drain current increase over a mono-structure, as discussed herein, lateral 2D metal dichalcogenide hetero-structures are desirable in some embodiments of the present disclosure.

Figure 7C:
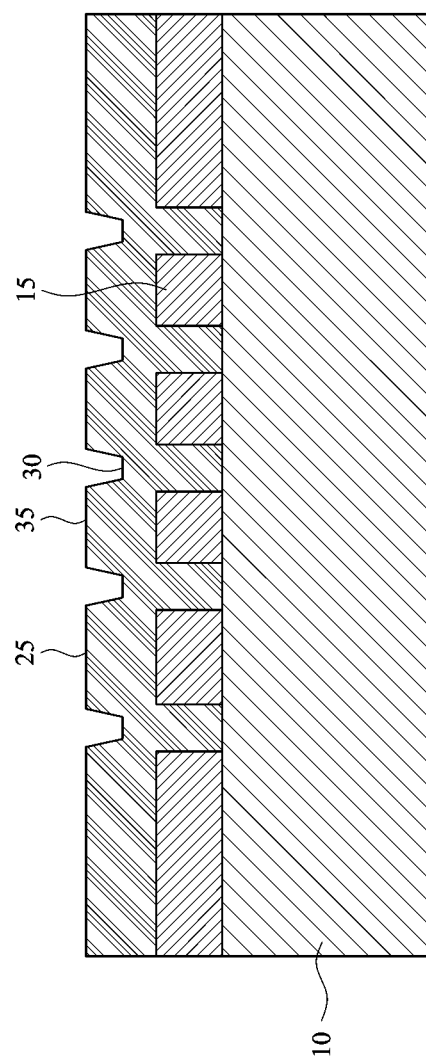
FIG. 7C is a cross-sectional view according to line A-A of FIG. 7B of one stage of the method for forming a semiconductor device according to an embodiment of the disclosure.

In some embodiments of the present disclosure, lateral 2D crystal hetero-structures are prepared by forming a first metal dichalcogenide film 15 on a substrate 10 and patterning the first metal dichalcogenide film 15 to form nm-sized trenches 20 in the first metal dichalcogenide film 15 exposing the underlying substrate 10, as shown in plan view in FIG. 7A. A 1-layer second metal dichalcogenide film 25 is transferred to the patterned first metal dichalcogenide film 15, as shown in FIG. 7B. The resulting structure in some embodiments, is a lateral 2D crystal hetero-structure with periodic type-I and type-II materials. The type-I 30 materials include a monolayer of the second metal dichalcogenide film 25 filling trench 20, and the type-II materials 35 include the second metal dichalcogenide film 25 overlying the first metal dichalcogenide film 15, as shown in FIG. 7B, and in FIG. 7C, which is a cross-sectional view corresponding to line A-A of FIG. 7B.

In some embodiments, the first and second metal dichalcogenide films have a thickness ranging from about 0.5 nm to about 10 nm. In some embodiments, the first and second metal dichalcogenide films are transition metal dichalcogenide films that are different from each other and are selected from the group consisting of $MoS_2$, $WS_2$, $MoSe_2$, $WSe_2$, $MoTe_2$, and $WTe_2$. The metal dichalcogenide films are formed by chemical vapor deposition (CVD) in some embodiments. In other embodiments, a metal film is formed on a substrate and then the metal film is reacted with a chalcogen to form the metal dichalcogenide films. In some embodiments, the substrate 10 includes silicon oxide or aluminum oxide substrates. In some embodiments, suitable silicon oxide substrates include silicon dioxide formed on a silicon wafer. In other embodiments, suitable aluminum oxide substrates include sapphire. In some embodiments, the first transition metal dichalcogenide film 15 is patterned to form trenches 20 using a suitable lithographic technique, including e-beam lithography and reactive ion etching (RIE). In some embodiments, the trenches 20 have a width of about 1 nm to about 10 nm and a length of about 15 nm to about 30 nm, and a first trench is spaced-apart from a second adjacent trench by a distance of about 5 nm to about 30 nm.

In some embodiments as shown in FIG. 7A, the trenches 20 have a width $W_T$, a length $L_T$, and a first trench is spaced-apart from a second adjacent trench by a distance $D_T$, wherein $D_T$ ranges from about $0.5W_T$ to about $30W_T$, and $L_T$ ranges from about $3W_T$ to about $30W_T$.

In some embodiments of the present disclosure, lateral 2D crystal hetero-structures are prepared by patterning a $WS_2$ film with e-beam lithography followed by reactive-ion etching (RIE) etching to form nm-sized trenches in the $WS_2$ film. After transferring a 1-layer $MoS_2$ to the patterned $WS_2$ film, a lateral 2D crystal hetero-structure with periodic type-I and type-II materials is obtained in some embodiments.

Due to type-II band alignment of $WS_2/MoS_2$ hetero-structure, electron injection from $WS_2$ to $MoS_2$ occurs. A channel with higher electron concentration is obtained, which enhances the field-effect mobility value for transistors fabricated on the $WS_2/MoS_2$ hetero-structure with $MoS_2$ as the channel.

Figure 8A:
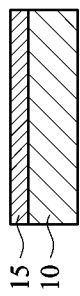
FIGS. 8A, 8B, 8C, 8D, 8E, 8F, 8G, 8H, 8I, and 8J are cross-sectional views of various sequential stages of a method for forming a semiconductor device according to an embodiment of the disclosure.
Figure 8B:
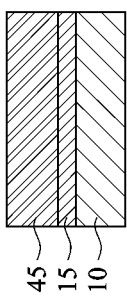
Figure 8C:
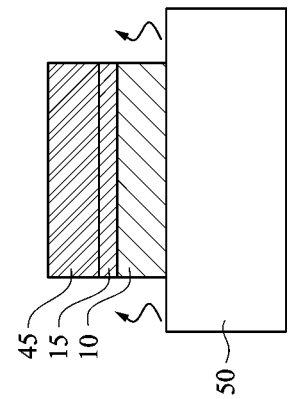
Figure 8D:
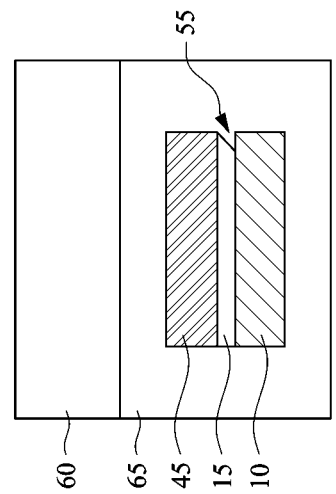
Figure 8F:
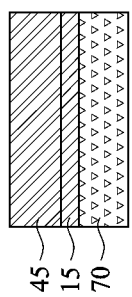
Figure 8E:
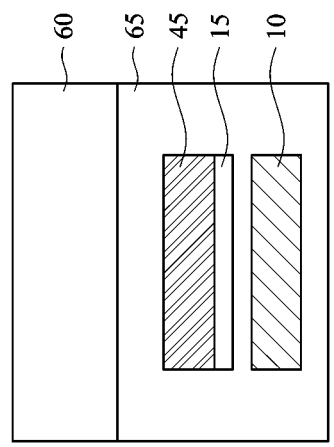

A method of forming and transferring a metal dichalcogenide film from one substrate to another substrate according to embodiments of the disclosure is illustrated in FIGS. 8A to 8J. As shown in FIG. 8A, a first metal dichalcogenide film 15 having a thickness of about 0.5 nm to about 10 nm is formed on a first substrate 10. The first metal dichalcogenide film 15 is formed by chemical vapor deposition (CVD) in some embodiments. In other embodiments, a first metal film is formed by sputtering or atomic layer deposition (ALD) and then the metal film is converted to a metal dichalcogenide by reacting the metal film with a chalcogen. A polymer film 45 having a thickness ranging from about 100 nm to about 5 am is formed on first metal dichalcogenide film 15, as shown in FIG. 8B. In some embodiments, the polymer film 45 is poly(methyl methacrylate) (PMMA). After forming the polymer film 45, the sample is heated, such as by placing the sample on a hot plate 50, as shown in FIG. 8C. The sample may be heated from about 30 seconds to about 20 minutes at a temperature of from about 70° C. to about 200° C. Subsequent to heating, a corner 55 of the first metal dichalcogenide film 15 is peeled off the substrate 10, such as by using a tweezers, and the sample is submerged in a vessel 60 containing a solution 65, as shown in FIG. 8D, to facilitate the separation of the first metal dichalcogenide film 15 from the first substrate 10, as shown in FIG. 8E. In some embodiments, the solution 65 is an aqueous base solution.

Figure 8H:
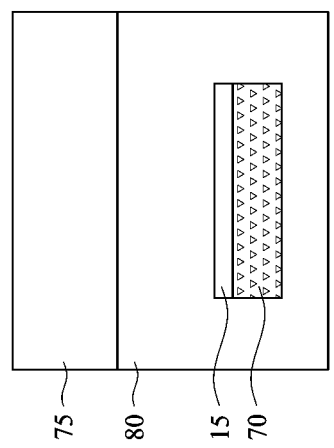
Figure 8G:
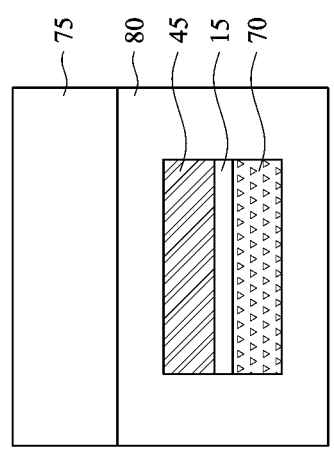

As shown in FIG. 8F, the first metal dichalcogenide film 15 and polymer film 45 are transferred to a second substrate 70. After applying the first metal dichalcogenide film 15 to the second substrate, the sample may stand for 30 minutes to 24 hours in some embodiments. In some embodiments, the second substrate 70 includes silicon oxide or aluminum oxide substrates. In some embodiments, suitable silicon oxide substrates include a silicon dioxide layer formed on a silicon layer. In other embodiments, suitable aluminum oxide substrates include sapphire. The polymer film 45 is removed from the first metal dichalcogenide film 15 using a suitable solvent. In some embodiments, the second substrate 70/first metal dichalcogenide film 15/polymer film 45 structure is submerged in a suitable solvent 80 in a vessel 75, as shown in FIG. 8G, until the polymer film 45 is dissolved, as shown in FIG. 8H. Any solvent 80 suitable for dissolving the polymer film 45 can be used. For example, in some embodiments, when the polymer film 45 is a PMMA film, acetone is used as the solvent 80.

Figure 8J:
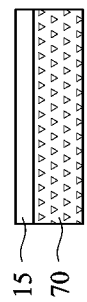
Figure 8I:
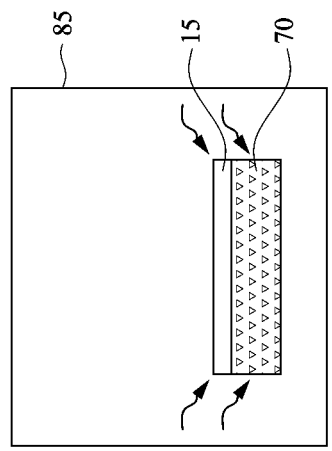

As shown in FIG. 8I, the first metal dichalcogenide film 15 and second substrate 70 are annealed in some embodiments by heating in an oven 85 at a temperature of about 200° C. to about 500° C. for about 30 minutes to about 5 hours, to provide a device having a 0.5 nm to 10 nm thick metal dichalcogenide film transferred from another substrate, as shown in FIG. 8J.

In one embodiment, the film transferring operations of 2D metal sulfide crystal films is performed as follows: (1) 1.5 μm-thick poly(methyl methacrylate) (PMMA) layer is spin-coated on the 2D metal sulfide crystal film; (2) the sample is heated on a hot plate at 120° C. for 5 min; (3) a small portion at a corner of the PMMA/2D crystal film is peeled off from the sapphire substrate with tweezers; (4) the sample is submerged in a KOH solution, and the PMMA/2D crystal film is completely peeled off; (5) the PMMA/2D crystal film is placed on a 300 nm $SiO_2$/Si substrate with source/drain electrodes formed thereon; (6) the sample is left to stand under atmospheric condition for 8 hours; (7) the sample is then submerged in acetone to remove the PMMA; and (8) the sample is annealed in a furnace at 350° C. for 2 hours to leave the 2D metal sulfide crystal film remaining on the surface of the $SiO_2$/Si substrate.

In another embodiment, the second metal dichalcogenide transferring operation is replaced with a deposition of a second metal film on the first metal dichalcogenide film and in the trenches followed by chalcogenization, as shown in FIGS. 9A-9D.

Figure 9D:
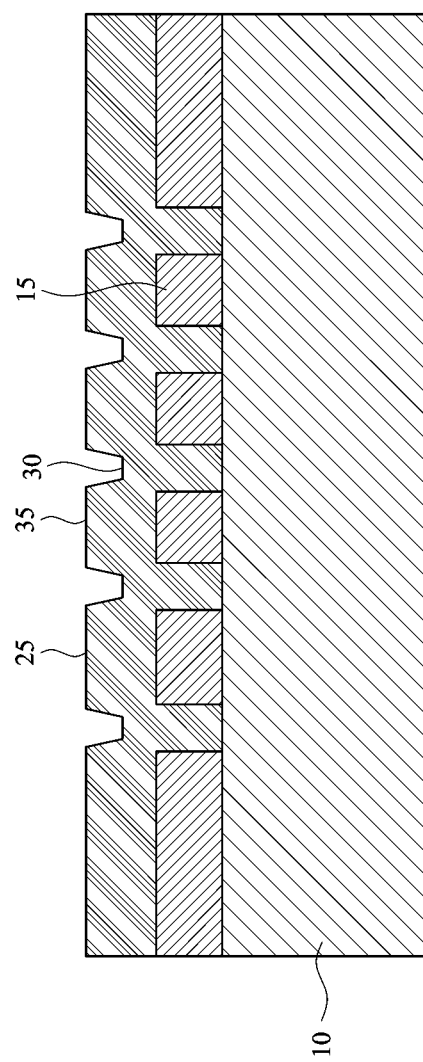
FIG. 9D is a cross-sectional view according to line B-B of FIG. 9C of one stage of the method for forming a semiconductor device according to an embodiment of the disclosure.

As shown in FIG. 9A, a first metal dichalcogenide film 15 is formed on a substrate 10 and the first metal dichalcogenide film 15 is patterned to form nm-sized trenches 20 in the first metal dichalcogenide film 15 exposing the underlying substrate 10. In some embodiments, the trenches 20 have a width of about 1 nm to about 10 nm and a length of about 15 nm to about 30 nm, and a first trench is spaced-apart from a second adjacent trench by a distance of about 5 nm to about 30 nm. An about 0.5 nm to about 10 nm thick second metal film 90 is formed on the first metal dichalcogenide film 15 and in the trenches 20, as shown in FIG. 9B. The second metal film 90 is formed by sputtering in some embodiments, and the second metal is a different metal than the metal in the first metal dichalcogenide film 15. The second metal film 90 is subsequently reacted with a chalcogen to form a lateral 2D crystal hetero-structure with periodic type-I and type-II materials is shown in FIG. 9C. In some embodiments, the type-I 30 materials include a monolayer of the second metal dichalcogenide film 25 filling the trench 20, and the type-II materials 35 include the second metal dichalcogenide film 25 overlying the first metal dichalcogenide film 15, as shown in FIG. 9C, and in FIG. 9D, which is a cross-sectional view corresponding to line B-B of FIG. 9C. Therefore, the same lateral 2D crystal hetero-structure with periodical type-I and type-II materials shown in FIG. 7C can also be obtained without performing the film transferring operations, as shown in FIGS. 9A-9D. In some embodiments, the thickness of the first metal dichalcogenide film 15 and the thickness of the second metal dichalcogenide film 25 are greater than a monolayer.

In some embodiments as shown in FIG. 9A, the trenches 20 have a width $W_T$, a length $L_T$, and a first trench is spaced-apart from a second adjacent trench by a distance $D_T$, wherein $D_T$ ranges from about $0.5W_T$ to about $30W_T$, and $L_T$ ranges from about $3W_T$ to about $30W_T$.

Figure 10D:
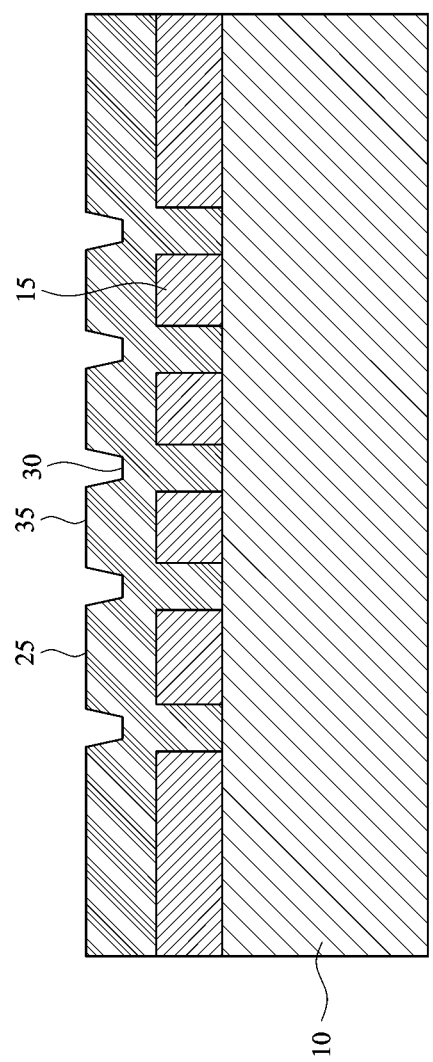
FIG. 10D is a cross-sectional view according to line C-C of FIG. 10C of one stage of the method for forming a semiconductor device according to an embodiment of the disclosure.

In another embodiment, first and second metal films are deposited, followed by conversion to a chalcogenide by reacting the metal films with a chalcogen, as shown in FIGS. 10A-10D. In some embodiments, an about 0.5 nm to about 10 nm thick first metal film 95 is deposited on a substrate 10, as shown in FIG. 10A. The first metal film 95 may be deposited by sputtering or atomic layer deposition (ALD). The substrate 10 may be masked or the entire substrate 10 may be covered with the first metal 95 and then subsequently patterned to form trenches 20. In some embodiments, the trenches 20 have a width of about 1 nm to about 10 nm and a length of about 15 nm to about 30 nm, and a first trench is spaced-apart from a second adjacent trench by a distance of about 5 nm to about 30 nm. An about 0.5 nm to about 10 nm thick second metal film 90 is subsequently formed on the first metal film 95 and in the trenches 20, as shown in FIG. 10B. The second metal film 90 is formed by sputtering in some embodiments, and the second metal is a different metal than the first metal. The first and second metal films 95 and 90 are subsequently converted to chalcogenide films by reaction with a chalcogen to form a lateral 2D crystal hetero-structure with periodic type-I and type-II materials is shown in FIG. 10C. In some embodiments, the type-I 30 materials include a monolayer of the second metal dichalcogenide film 25 filling the trench 20, and the type-II materials 35 include the second metal dichalcogenide film 25 overlying the first metal dichalcogenide film 15, as shown in FIG. 10C, and in FIG. 10D, which is a cross-sectional view corresponding to line C-C of FIG. 10C. Therefore, the same lateral 2D crystal hetero-structure with periodical type-I and type-II materials shown in FIG. 7C can also be obtained without performing the film transferring operation, as shown in FIGS. 10A-10D. The present disclosure is not limited to monolayers of type-I and type-II materials. In some embodiments, the layers of type-I and type-II materials are thicker than monolayers.

Figure 11B:
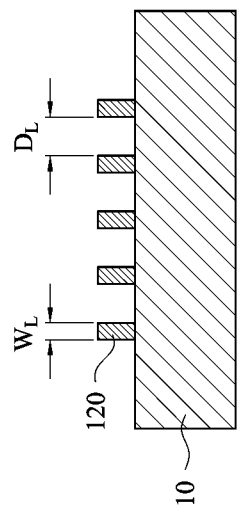
FIGS. 11A, 11B, 11D, and 11E are cross-sectional views of various sequential stages of a method for forming a semiconductor device according to an embodiment of the disclosure.
Figure 11A:
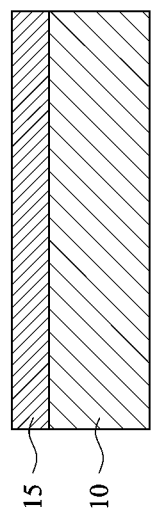
Figure 11C:
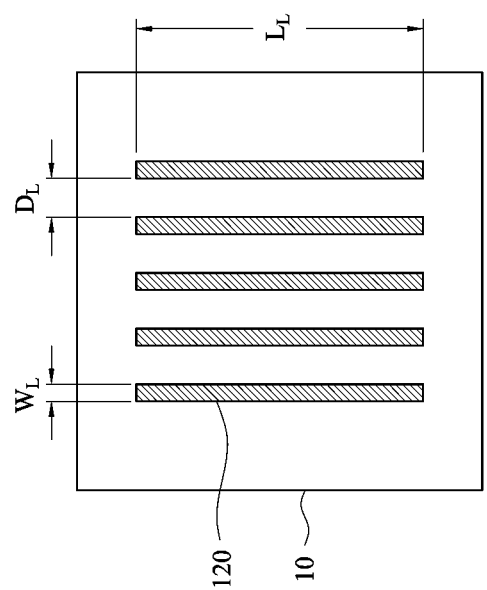
FIG. 11C is a plan view of FIG. 11B.
Figure 11E:
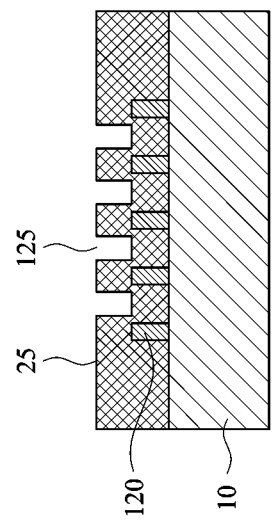

FIGS. 11A-11E are views of various sequential stages of a method for forming a semiconductor device according to an embodiment of the disclosure. In some embodiments of the present disclosure, lateral 2D crystal hetero-structures are prepared by forming a first metal dichalcogenide film 15 on a substrate 10 as shown in cross-sectional view in FIG. 11A. The first metal dichalcogenide film 15 is subsequently patterned to form a plurality of nm-sized lines 120 made of the first metal dichalcogenide film 15, as shown in cross-sectional view in FIG. 11B. The underlying substrate 10 is exposed surrounding the lines 120. In some embodiments, the plurality of first metal dichalcogenide lines 120 are arranged in a substantially parallel configuration. FIG. 11C is a plan view of FIG. 11B.

Figure 11D:
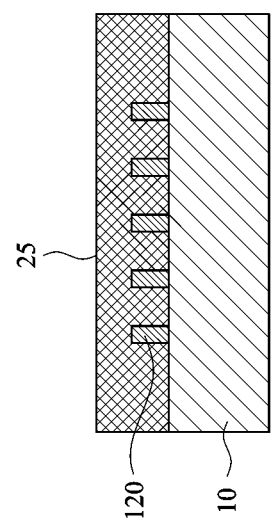

A second metal dichalcogenide film 25 is subsequently formed overlying the first metal dichalcogenide lines 120, as shown in cross-sectional view in FIG. 11D. In some embodiments, the second metal dichalcogenide film 25 is planarized using an etchback operation. A plurality of trenches 125 are subsequently formed in portions of the second metal dichalcogenide film 25 between the first metal dichalcogenide lines 120 using a suitable lithographic technique, including e-beam lithography and reactive ion etching (RIE), as shown in cross-sectional view in FIG. 11E.

In some embodiments, the first and second metal dichalcogenide films have a thickness ranging from about 0.5 nm to about 10 nm. In some embodiments, the first metal dichalcogenide film is a monolayer. In some embodiments, the first and second metal dichalcogenide films are transition metal dichalcogenide films that are different from each other and are selected from the group consisting of $MoS_2$, $WS_2$, $MoSe_2$, $WSe_2$, $MoTe_2$, and $WTe_2$. The metal dichalcogenide films are formed by chemical vapor deposition (CVD) in some embodiments. In some embodiments, the substrate 10 includes silicon oxide or aluminum oxide substrates. In some embodiments, suitable silicon oxide substrates include silicon dioxide formed on a silicon wafer. In other embodiments, suitable aluminum oxide substrates include sapphire. In some embodiments, the second metal dichalcogenide film 25 is patterned to form trenches 125 using a suitable lithographic technique, including e-beam lithography and reactive ion etching (RIE). In some embodiments, the lines 120 and the trenches 125 have a width of about 1 nm to about 10 nm and a length of about 15 nm to about 30 nm, the first line is spaced apart from a second adjacent line by a distance of about 5 nm to about 30 nm, and a first trench is spaced-apart from a second adjacent trench by a distance of about 6 nm to about 31 nm.

In some embodiments, as shown in FIGS. 11B and 11C, the lines 120 have a width $W_L$, a length $L_L$, and a first line is spaced-apart from a second adjacent line by a distance $D_L$, wherein $D_L$ ranges from about $0.5W_L$ to about $30W_L$, and $L_L$ ranges from about $3W_L$ to about $30W_L$.

An application of the lateral hetero-structures according to the present disclosure is multi-channel transistors. For example, higher electron concentrations are obtained in the $MoS_2$ regions in the trenches of the $WS_2$ film and $WS_2$ is much less conductive than $MoS_2$, the results would be similar to a multi-channel high-electron-mobility transistor (HEMT). The major difference is the arrangement of the lateral hetero-structures instead of a vertical hetero-structure.

Figure 12A:
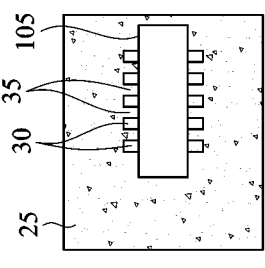
FIGS. 12A, 12B, 12C, and 12D are plan views of various sequential stages of a method for forming a semiconductor device according to an embodiment of the disclosure.

A method of fabrication a multi-channel top-gated transistor with lateral 2D crystal hetero-structures is shown in FIGS. 12A-12E. A first transition metal dichalcogenide film 15 is formed on a substrate 10, as shown in plan view FIG. 12A. Lateral multi-quantum wells (QWs) are fabricated using the 2D crystal hetero-structures of the present disclosure. Trenches 20 are formed by e-beam lithography and reactive ion etching to have a width a of about 1 nm to about 10 nm, and spaced-apart by a distance b of from about 20 nm to about 30 nm, as shown in FIG. 12A. The trench length l is <30 nm in some embodiments. The trenches 20 are channel regions of the semiconductor device, and the trenches 20 comprise a first central portion of the channel regions, and second end portions of the channel regions at opposing ends of the first central portion.

Besides the carrier injection phenomenon of 2D crystal hetero-structure of the present disclosure, the lateral quantum well structure will further enhance the device mobility of the transistor. In addition, the quantum well numbers are used to control the drain current level of the devices in some embodiments.

Figure 12B:
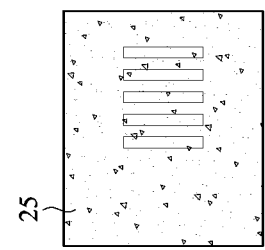
Figure 12C:
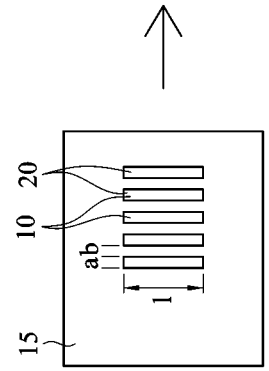
Figure 12D:
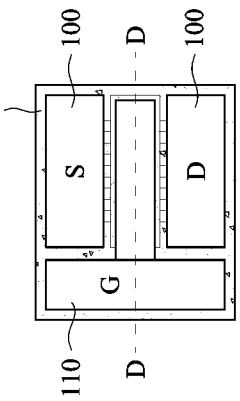
Figure 12E:
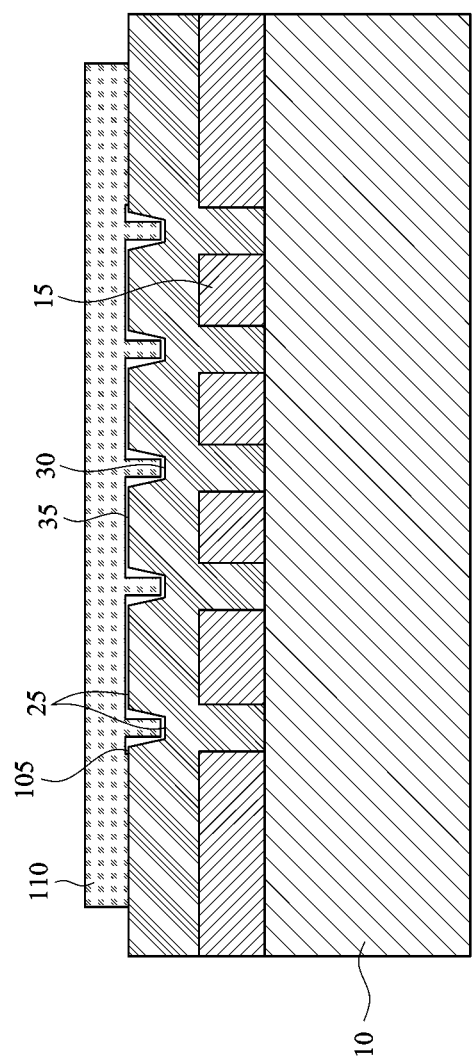
FIG. 12E is a cross-sectional view according to line D-D of FIG. 12D of one stage of the method for forming a semiconductor device according to an embodiment of the disclosure.

A second metal dichalcogenide film 25 different from the first metal dichalcogenide film 15 is formed on the first metal dichalcogenide film 15 and in the trenches 20, as shown in FIG. 12B, thereby forming a lateral 2D crystal hetero-structure with periodic type-I and type-II materials is shown in FIG. 12C. A gate dielectric layer 105 is subsequently formed over the first central portion of the channel regions 30, a gate electrode 110 is formed over the gate dielectric layer 105, and source/drain electrodes 100 are formed over the second end portions of the channel regions 30, as shown in FIG. 12D, and in FIG. 12E, which is a cross-sectional view corresponding to line D-D of FIG. 12D. The gate dielectric layer 105 can be formed of any suitable dielectric material, and can be formed using suitable deposition, photolithographic, and etching operations. The gate electrode 110 and source/drain electrodes 100 can be formed by suitable metal deposition and patterning operations. Any suitable metal can be used as the electrodes.

By reducing the channel separation b to <10 nm, the lateral quantum wells will become lateral superlattice (SL) structures. The major difference between superlattice structures and quantum wells is that the carrier transport of superlattices is through mini-bands instead of through single energy levels. With the help of superlattice structures, the mobility values of the 2D crystal hetero-structure transistors are further enhanced in some embodiments. Similar to the quantum wells, the drain current level is controlled by using the channel numbers. Because the channel density per unit area of the superlattice structures is higher than quantum wells, it is expected that higher drain currents are obtained by using lateral 2D crystal superlattice structures as the channel of the transistors.

Another application of the lateral 2D crystal hetero-structures are quantum-well infrared photodetectors (QWIPs) used for thermal imaging. Typically, QWIPs are fabricated by using vertical multi-layer GaAs/(AlGa)As quantum wells. Because of the limitations of the selection rule for the intra-band transition, the vertical device can not absorb normally incident light. Therefore, additional light coupling schemes, such as gratings are used for device fabrication, which is very difficult considering the 20-30 μm pitch size.

Figure 13E:
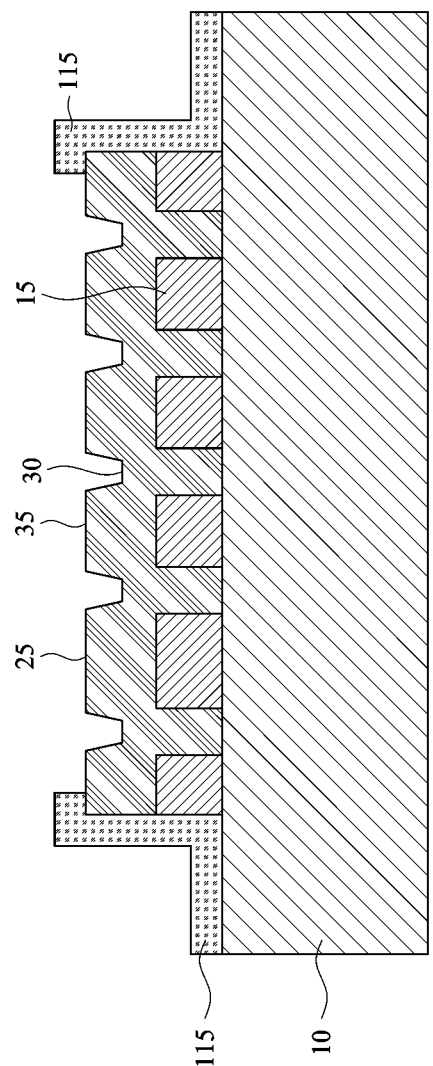
FIG. 13E is a cross-sectional view according to line E-E of FIG. 13D of one stage of the method for forming a semiconductor device according to an embodiment of the disclosure.

FIGS. 13A-13E illustrate a method of fabricating a semiconductor device, such as a quantum-well infrared photodetector, according to an embodiment of the present disclosure. A first metal dichalcogenide film 15 is formed on a substrate 10, as shown in plan view FIG. 13A. Lateral multi-quantum wells (QWs) are fabricated using the 2D crystal hetero-structures of the present disclosure. Trenches 20, in which channels are subsequently formed, are formed by e-beam lithography and reactive ion etching to have a width a of about 1 nm to about 10 nm, and spaced-apart by a distance b of from about 20 nm to about 30 nm, as shown in FIG. 13A. The channel length l is about 30 nm in some embodiments.

A second metal dichalcogenide film 25 different from the first metal dichalcogenide film 15 is formed on the first metal dichalcogenide film 15 and in the trenches 20, as shown in FIG. 13B, thereby forming a lateral 2D crystal hetero-structure with periodic type-I and type-II materials is shown in FIG. 13C. The peripheral areas of the structure are removed to form a mesa surrounded by the substrate 10. The peripheral area is removed by masking and etching in some embodiments. Conductive contacts 115 are formed on opposing end regions of the 2D crystal hetero-structure. The conductive contacts 115 are formed of a suitable conductive metal, such as Al, Au, Ag, Co, Cu, Ni, Ta, Ti, W, and combinations thereof, in some embodiments. The conductive contacts 115 may be formed by sputtering, CVD, ALD, electroplating or other suitable method.

FIG. 13E is a cross-sectional view corresponding to line E-E of FIG. 13D. The lateral 2D crystal hetero-structure with periodic type-I and type-II materials is shown in FIG. 13D. The type-I 30 materials include the second metal dichalcogenide film 25 on the substrate 10, and the type-II materials 35 include the second metal dichalcogenide film 25 overlying the first metal dichalcogenide film 15.

In certain embodiments of the present disclosure, lateral quantum-well structures having 2D crystal hetero-structures are provided having $WS_2$ filled trenches having widths a of about 1 nm to about 10 nm. In this case, the channel separation b is about 20 nm to about 30 nm and the channel length l is about 30 nm. QWIPs fabricated with this arrangement will be very sensitive to normally incident light. Similar to the nm range channel separation b to form superlattice (SL) structures for transistors disclosed herein, the same concept can also be applied to infrared photodetector applications. When the channel separation b is 5 nm to about 10 nm, SL structures will form and the single energy level will become bands. In this case, the superlattice infrared photodetectors (SLIPs) can also be used to absorb normally incident infrared light. A major advantage of SLIPs is their lower operation voltages.

When the channel separation b is about 20 nm to about 30 nm, the fabricated device can be a QWIP. When the channel separation b is reduced to <10 nm, the fabricated device can be a SLIP. The channel number of either the QWIPs or the SLIPs can range from about 30 to about 100 in some embodiments.

The present disclosure provides the benefit of fabricating a semiconductor device having 2D lateral hetero-structures using 1-time e-beam lithography followed by RIE etching. The operations described herein can be applied to large-area 2D crystal films. Furthermore, the present disclosure provides multi-channel transistors with lateral hetero-structures with significantly increased device performance. In addition, the present disclosure provides lateral quantum-well structures that are useful for infrared photodetector applications.

An embodiment of the present disclosure is a method of fabricating a semiconductor device having two dimensional (2D) lateral hetero-structures. The method includes forming alternating regions of a first metal dichalcogenide film and a second metal dichalcogenide film extending along a surface of a first substrate. The first metal dichalcogenide and the second metal dichalcogenide films are different metal dichalcogenides. Each second metal dichalcogenide film region is bordered on opposing lateral sides by a region of the first metal dichalcogenide film, as seen in cross-sectional view. In an embodiment, the forming alternating regions of a first metal dichalcogenide film and a second metal dichalcogenide film includes forming the first metal dichalcogenide film on the surface of the first substrate, patterning the first metal dichalcogenide film on the surface of the first substrate to form one or more trenches in the first metal dichalcogenide film, and forming the second metal dichalcogenide film over the first metal dichalcogenide film and in the one or more trenches. In an embodiment, the one or more trenches are formed using a lithographic operation and an etching operation. In an embodiment, the lithographic operation is electron beam lithography and the etching operation is reactive-ion etching. In an embodiment, the forming the first metal dichalcogenide film on the first substrate includes: forming a first metal film on the first substrate, and sulfurizing, selenizing, or tellurizing the first metal film to form the first metal dichalcogenide film. In an embodiment, the forming the second metal dichalcogenide film further includes: forming a first metal film over the first metal dichalcogenide film and in the one or more trenches, and sulfurizing or selenizing the first metal film to form the second metal dichalcogenide film. In an embodiment, the one or more trenches have a width of about 1 nm to about 10 nm, and a length of about 15 nm to about 30 nm. In an embodiment, a first trench is spaced-apart from a second adjacent trench by a distance of about 5 nm to about 30 nm.

In an embodiment, the method includes forming a dielectric layer overlying a first central portion of the second metal dichalcogenide film, forming a gate electrode over the dielectric layer, and forming source/drain electrodes over second end portions at opposing ends of the first central portion of the second metal dichalcogenide film. In an embodiment, the forming alternating regions of a first metal dichalcogenide film and a second metal dichalcogenide film includes forming a first metal film on the surface of the substrate, patterning the first metal film to form one or more trenches in the first metal film, forming a second metal film in the one or more trenches, and sulfurizing, selenizing, or tellurizing the first metal film and the second metal film to form the first and second metal dichalcogenide films, wherein the first and the second metal films are different metals. In an embodiment, the first metal dichalcogenide film has a thickness of about 0.5 nm to about 10 nm. In an embodiment, the method includes forming the second metal dichalcogenide film on a second substrate, and transferring the second metal dichalcogenide film from the second substrate to the first metal dichalcogenide film. In an embodiment, the second substrate is sapphire. In an embodiment, the first and second metal dichalcogenides include a transition metal dichalcogenide. In an embodiment, the transition metal dichalcogenides are selected from the group consisting of $WS_2$, $MoS_2$, $WSe_2$, $MoSe_2$, $WTe_2$, and $MoTe_2$. In an embodiment, the second metal dichalcogenide film is a monolayer film. In an embodiment, the method includes removing a portion of the first metal dichalcogenide film from a peripheral region of the first substrate exposing the first substrate in the peripheral region, and forming conductive contacts at opposing end regions of the first metal dichalcogenide film.

Another embodiment of the present disclosure is a method of fabricating a semiconductor device having two dimensional (2D) lateral hetero-structures. The method includes forming a first metal dichalcogenide film on a surface of a substrate. The first metal dichalcogenide film on the surface of the substrate is patterned to form a plurality of trenches in the first metal dichalcogenide film. The trenches have a width $W_T$, a length $L_T$, and a first trench is spaced-apart from a second adjacent trench by a distance $D_T$, wherein $D_T$ ranges from about $0.5W_T$ to about $30W_T$, and $L_T$ ranges from about $3W_T$ to about $30W_T$. The first metal dichalcogenide and the second metal dichalcogenide films are different metal dichalcogenides, and the second metal dichalcogenide film is a monolayer film.

In another embodiment of the present disclosure, a semiconductor device includes a first metal dichalcogenide film disposed on a substrate. The first metal dichalcogenide film has one or more trenches formed therein. A second metal dichalcogenide film is disposed in the one or more trenches. The first metal dichalcogenide film and the second metal dichalcogenide film are different metal dichalcogenides. A gate dielectric layer is disposed over a central portion of the second metal dichalcogenide film. A gate electrode layer is disposed over the gate dielectric layer, and source/drain electrodes are disposed over opposing end portions of the second metal dichalcogenide film. In an embodiment, the second metal dichalcogenide film is a monolayer film.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device having two dimensional (2D) lateral hetero-structures, comprising:
   forming alternating regions of a first metal dichalcogenide film and a second metal dichalcogenide film extending along a surface of a first substrate,
   wherein the first metal dichalcogenide and the second metal dichalcogenide films are different metal dichalcogenides, and
   each second metal dichalcogenide film region is bordered on opposing lateral sides by a region of the first metal dichalcogenide film, as seen in cross-sectional view.

2. The method of claim 1, wherein the forming alternating regions of a first metal dichalcogenide film and a second metal dichalcogenide film comprises:
   forming the first metal dichalcogenide film on the surface of the first substrate;
   patterning the first metal dichalcogenide film on the surface of the first substrate to form one or more trenches in the first metal dichalcogenide film; and
   forming the second metal dichalcogenide film over the first metal dichalcogenide film and in the one or more trenches.

3. The method of claim 2, wherein the one or more trenches are formed using a lithographic operation and an etching operation.

4. The method of claim 3, wherein the lithographic operation is electron beam lithography and the etching operation is reactive-ion etching.

5. The method of claim 2, wherein the forming the first metal dichalcogenide film on the first substrate comprises:
   forming a first metal film on the first substrate; and
   sulfurizing, selenizing, or tellurizing the first metal film to form the first metal dichalcogenide film.

6. The method of claim 2, wherein the forming the second metal dichalcogenide film further comprises:
   forming a first metal film over the first metal dichalcogenide film and in the one or more trenches; and
   sulfurizing, selenizing, or tellurizing the first metal film to form the second metal dichalcogenide film.

7. The method of claim 2, wherein the one or more trenches have a width of about 1 nm to about 10 nm, and a length of about 15 nm to about 30 nm.

8. The method of claim 7, wherein a first trench is spaced-apart from a second adjacent trench by a distance of about 5 nm to about 30 nm.

9. The method of claim 2, further comprising:
   forming a dielectric layer overlying a first central portion of the second metal dichalcogenide film;
   forming a gate electrode over the dielectric layer; and
   forming source/drain electrodes over second end portions at opposing ends of the first central portion of the second metal dichalcogenide film.

10. The method of claim 1, wherein the forming alternating regions of a first metal dichalcogenide film and a second metal dichalcogenide film comprises:
    forming a first metal film on the surface of the substrate;
    patterning the first metal film to form one or more trenches in the first metal film;
    forming a second metal film in the one or more trenches; and sulfurizing, selenizing, or tellurizing the first metal film and the second metal film to form the first and second metal dichalcogenide films,
wherein the first and the second metal films are different metals.

11. The method of claim 1, wherein the first metal dichalcogenide film has a thickness of about 0.5 nm to about 10 nm.

12. The method of claim 1, further comprising forming the second metal dichalcogenide film on a second substrate; and
transferring the second metal dichalcogenide film from the second substrate to the first metal dichalcogenide film.

13. The method of claim 12, wherein the second substrate is sapphire.

14. The method of claim 1, wherein the first and second metal dichalcogenides comprise a transition metal dichalcogenide.

15. The method of claim 14, wherein the transition metal dichalcogenides are selected from the group consisting of $WS_2$, $MoS_2$, $WSe_2$, $MoSe_2$, $WTe_2$, and $MoTe_2$.

16. The method of claim 1, wherein the second metal dichalcogenide film is a monolayer film.

17. The method of claim 1, further comprising:
removing a portion of the first metal dichalcogenide film from a peripheral region of the first substrate exposing the first substrate in the peripheral region; and
forming conductive contacts at opposing end regions of the first metal dichalcogenide film.

18. A method of fabricating a semiconductor device having two dimensional (2D) lateral hetero-structures, comprising:
forming a first metal dichalcogenide film on a surface of a substrate;
patterning the first metal dichalcogenide film on the surface of the substrate to form a plurality of trenches in the first metal dichalcogenide film,
wherein the trenches have a width $W_T$, a length $L_T$, and a first trench is spaced-apart from a second adjacent trench by a distance $D_T$, wherein $D_T$ ranges from about $0.5W_T$ to about $30W_T$, and $L_T$ ranges from about $3W_T$ to about $30W_T$; and
forming a second metal dichalcogenide film over the first metal dichalcogenide film,
wherein the first metal dichalcogenide and the second metal dichalcogenide films are different metal dichalcogenides, and
wherein the second metal dichalcogenide film is a monolayer film.

19. A method of fabricating a semiconductor device having two dimensional (2D) lateral hetero-structures, comprising:
forming a first metal dichalcogenide film on a surface of a substrate;
patterning the first metal dichalcogenide film on the surface of the substrate to form a plurality of trenches in the first metal dichalcogenide film;
forming a second metal dichalcogenide film over the first metal dichalcogenide film,
wherein the first metal dichalcogenide film and the second metal dichalcogenide film are different metal dichalcogenides, and
wherein alternating first regions of a monolayer of the second metal dichalcogenide film and second regions of the second metal dichalcogenide film over the first metal dichalcogenide film are formed over the substrate.

20. The method according to claim 19, further comprising forming a gate electrode over the second metal dichalcogenide film, wherein the gate electrode extends into recesses in the second metal dichalcogenide film, and the recesses are located over the first regions of the monolayer of the second metal dichalcogenide film.

* * * * *